ated area of the chip comprises a plurality of redundancy data-containing storage loops of equal number to the information data-containing storage loops so as to correspond thereto in a one-on-one relationship, with the number of individual bit positions included in each information data-containing storage loop being significantly greater than the number of bit positions included in each individual redundancy data-containing storage loop. At least one bubble detector is included on the chip, being associated with the information data-containing bubble storage loops and the redundancy data-containing storage loops for receiving readout of information data and redundancy data in an alternating coordinated sequence with each bit of information data from a respective information data-containing storage loop being preceded by a bit of redundancy data from the corresponding redundancy data-containing storage loop which identifies whether the following bit of information data is from a good or a defective information data-containing storage loop. The output from the detector is operably controlled by appropriate logic circuitry for restricting the usable readout from the information data-containing bubble storage loops to data which is delivered from good storage loops as determined by the redundancy data imparted by respective redundancy data-containing storage loops.

United States Patent [19]

Naden

[11] 4,321,693
[45] Mar. 23, 1982

[54] MAGNETIC BUBBLE MEMORY CHIP WITH DEDICATED REDUNDANCY DATA SECTION PROVIDED THEREON

[75] Inventor: Rex A. Naden, Lubbock, Tex.

[73] Assignee: Texas Instruments Incorporated, Dallas, Tex.

[21] Appl. No.: 174,310

[22] Filed: Jul. 31, 1980

[51] Int. Cl.$^3$ .............................................. G11C 19/08
[52] U.S. Cl. ......................................... 365/15; 365/12
[58] Field of Search ............................. 365/15, 16, 12

[56] References Cited

U.S. PATENT DOCUMENTS 4,228,522 10/1980 George .................................. 365/15

Primary Examiner—James W. Moffitt
Attorney, Agent, or Firm—William E. Hiller; Melvin Sharp; James T. Comfort

[57] ABSTRACT

A magnetic bubble memory chip structure on which a plurality of magnetic bubble storage loops are provided for containing information data as represented by bubbles and voids and including a dedicated area on the chip for containing redundancy data as represented by a chain of bubbles and voids arranged in a predetermined manner to identify good and defective information data storage loops. The redundancy data-containing dedi- 14 Claims, 5 Drawing Figures

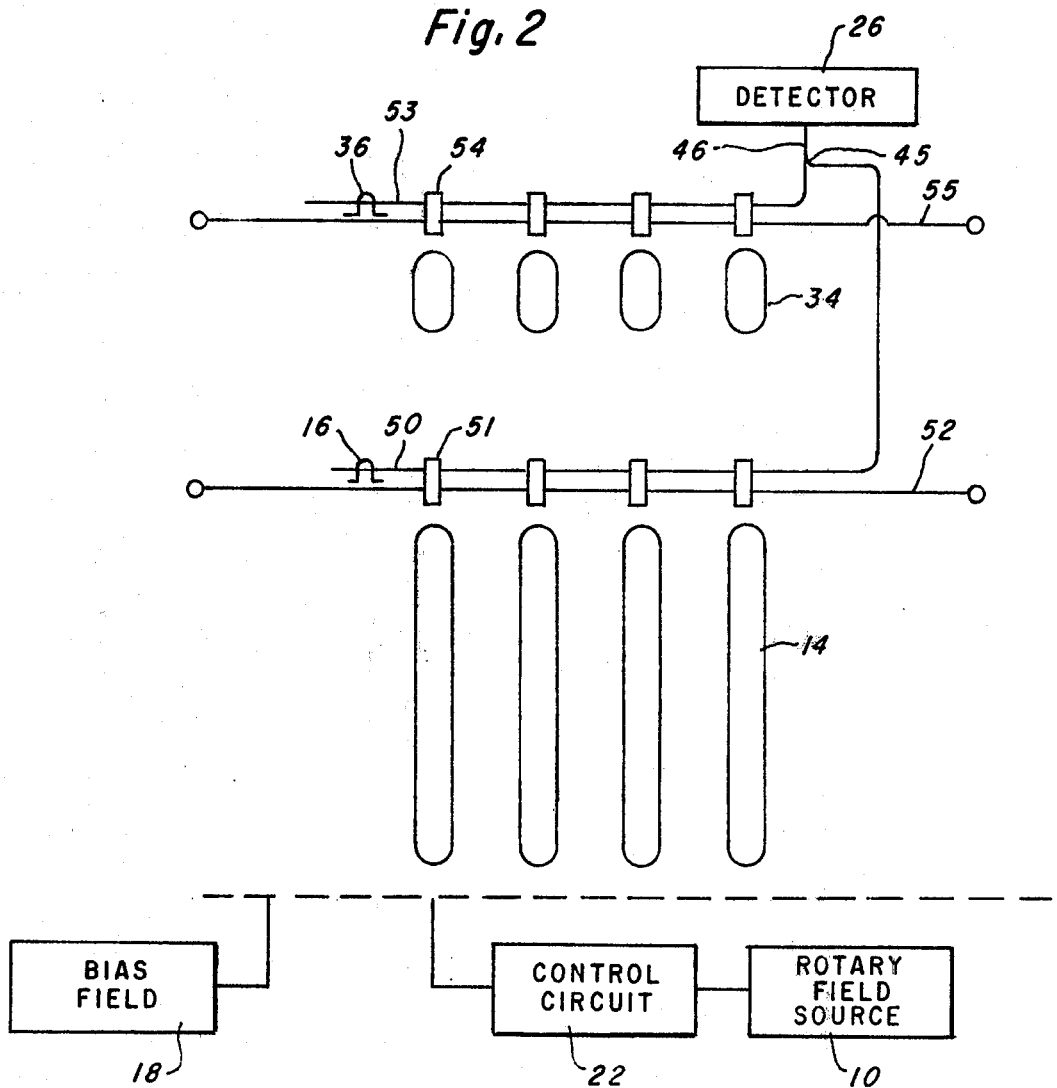

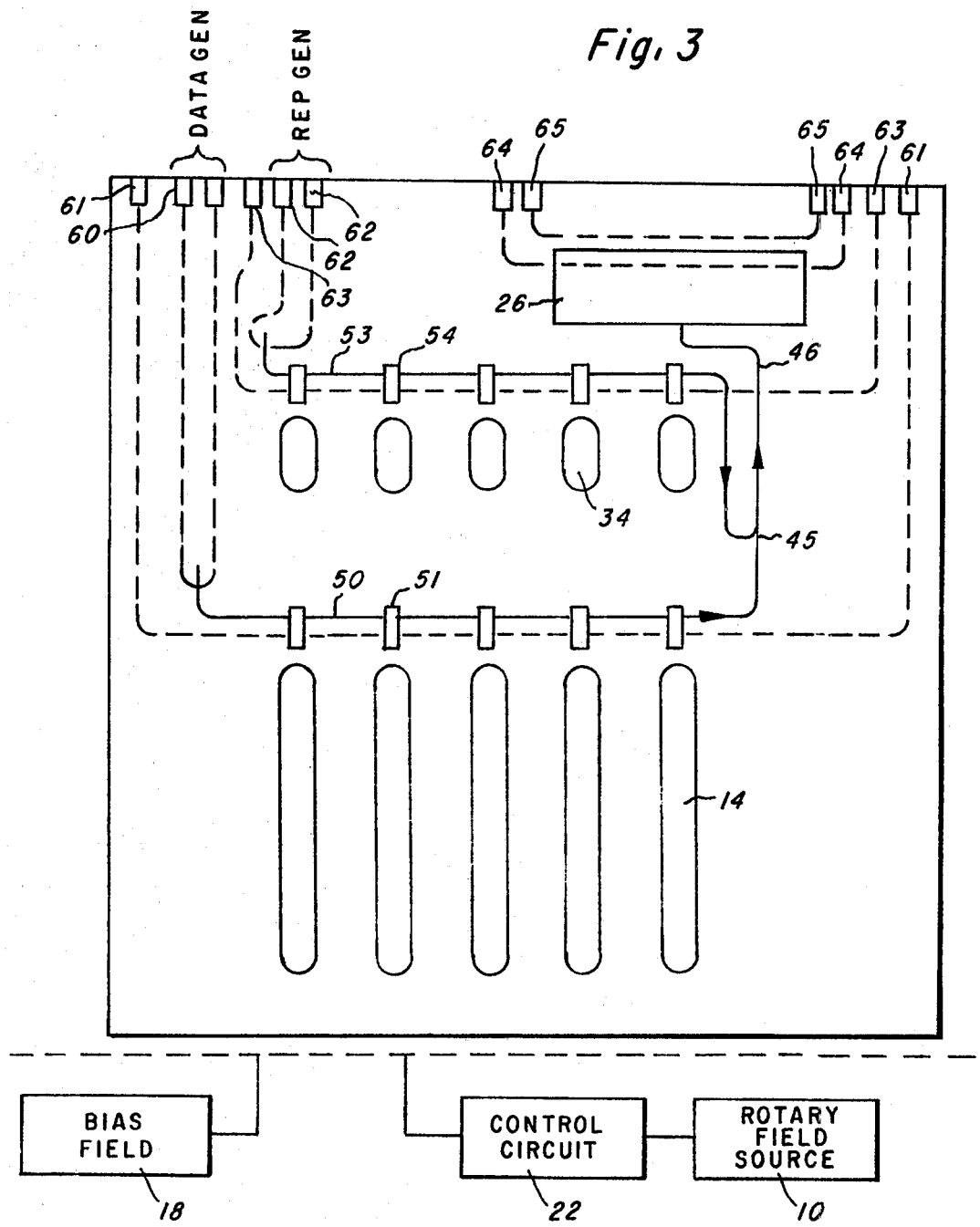

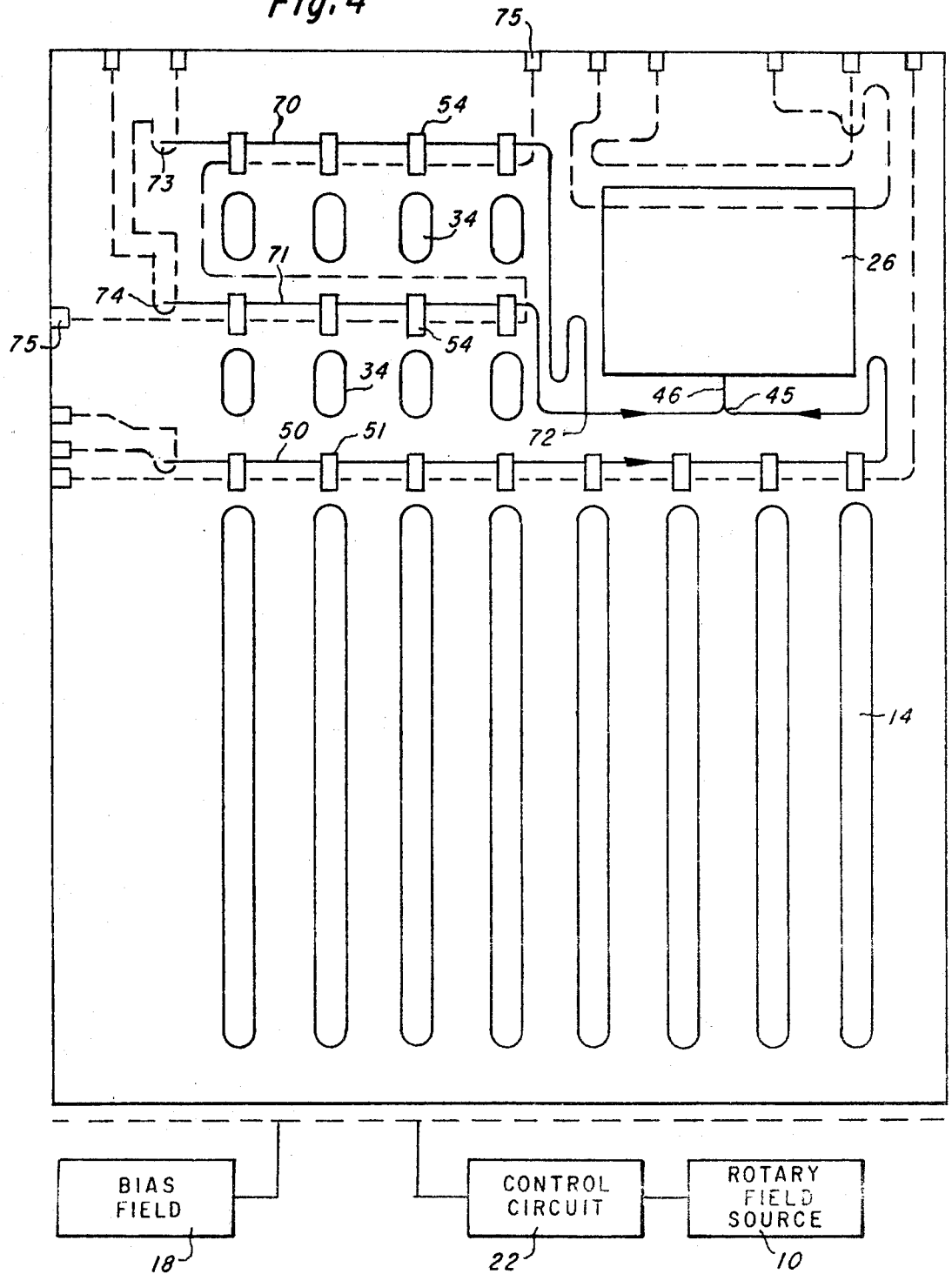

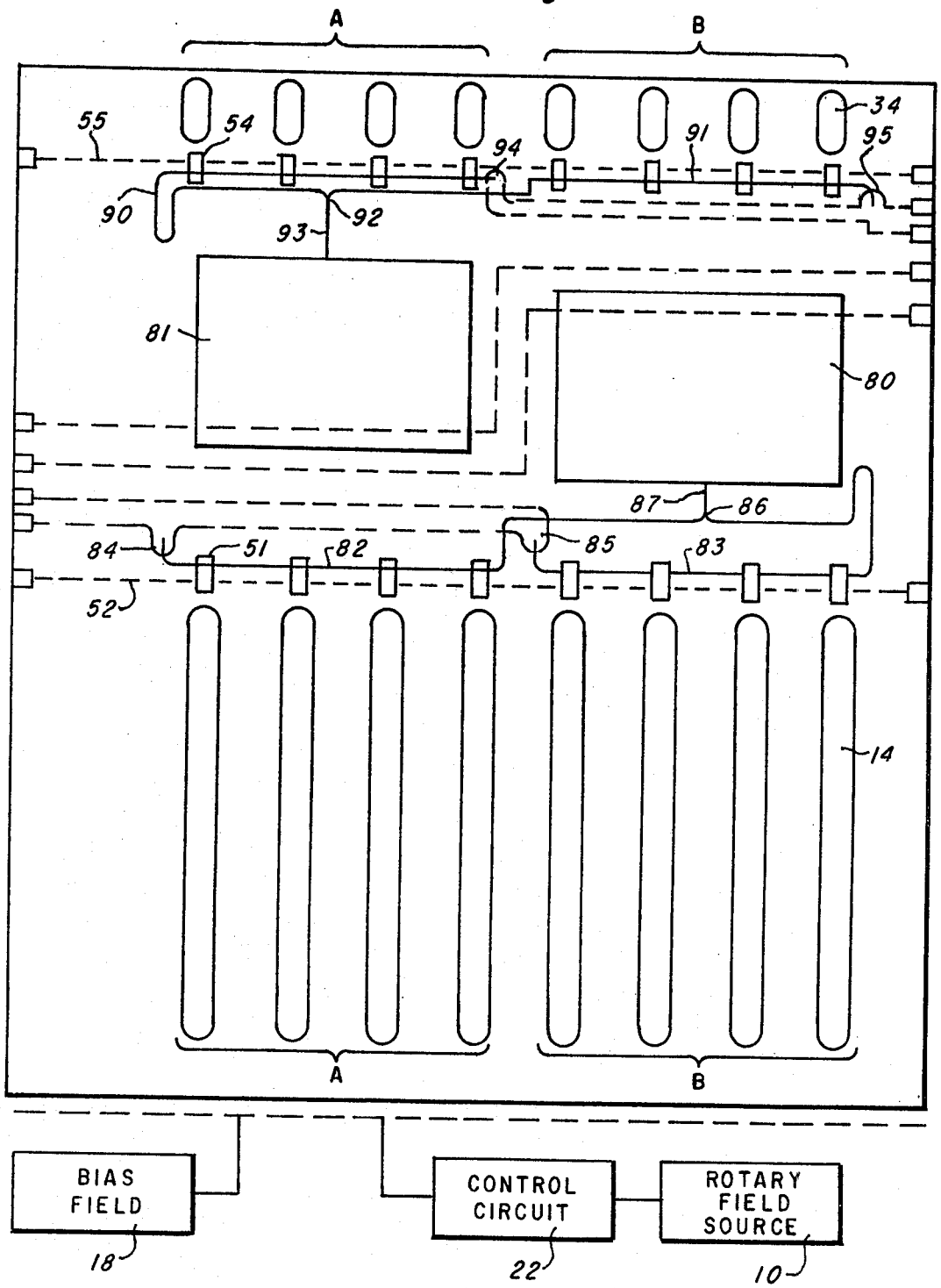

MAGNETIC BUBBLE MEMORY CHIP WITH DEDICATED REDUNDANCY DATA SECTION PROVIDED THEREON

BACKGROUND OF THE INVENTION

This invention relates to magnetic bubble memory structures of the type including redundancy data-containing areas thereon in addition to information data-containing storage sections to enable utilization of chips having one or more defective portions in the information data-containing storage section which are incapable of propagating and/or properly processing data therein as represented by a chain of magnetic bubbles and voids arranged in a predetermined sequence. More particularly, this invention concerns different embodiments of a magnetic bubble memory chip architecture in which the redundancy data contained thereon is stored in special redundancy storage loops corresponding to the plurality of bubble storage loops included in the information data-containing storage section of the chip, but having a relatively limited number of bit positions per redundancy storage loop as compared to the bit positions included in a respctive information data-containing storage loop.

Magnetic bubble memory structures typically include one or more memory storage loops, accommodating a plurality of magnetic single-walled domains or bubbles, each of which represents one bit of binary information. These bubbles may be rotated about individual memory storage loops in a synchronized and controlled manner such that access to the stored information imparted thereby can be gained. In one form of magnetic bubble memory circuit architecture generally known as the "block replicate" form, the chip is arranged with input and output sections with an intermediate bubble storage section being disposed between the input and output sections, such that data in the form of chains of bubbles and voids may be entered into the bubble storage section via the input section for subsequent readout when desired from the bubble storage section via the output section to a suitable bubble detector. The bubble storage section is organized as a plurality of information data-containing storage loops, wherein information in the form of a series of magnetic bubbles and voids respectively representing binary "1's" and "0's" may be transferred between the input section and each of the respective information data-containing storage loops and from the storage loops to the output section, thereby enabling information to be written into the memory and to be read out from the memory as desired.

The magnetic bubble memory chip comprises a substrate of non-magnetic material on which a planar film or layer or magnetic material capable of supporting magnetic bubbles is disposed. The magnetic bubbles are caused to travel along predetermined paths within the layer of bubble-supporting magnetic material by laying down a magnetizable bubble propagation path pattern on the layer of magnetic material as a series of thin film propagation elements of magnetically soft material, e.g. permalloy, in the form of tiny geometric shapes or circuit elements. In this respect, a magnetic drive field within the plane of the layer of magnetic material is rotated which causes the individual propagation elements included in the bubble propagation path pattern to be sequentially polarized in a cyclical sequence causing the individual bubbles to be propagated in a stepwise movement along the path as defined by the magnetizable propagation elements. One such overlay pattern commonly employed in a magnetic bubble memory chip is the so-called series of alternating T-shaped and bar-shaped permalloy elements. More recently, permalloy elements in the form of individual asymmetric chevrons have found favor as propagation path elements in magnetic bubble memory chip structures.

The planar film or layer of magnetic material capable of supporting magnetic bubbles as employed in these magnetic bubble memory structures has a magnetically easy direction essentially perpendicular to the plane of the structure. Magnetic properties such as magnetization anisotrophy, coercivity and mobility, are such that the device may be maintained magnetically saturated with magnetization in a direction out of the plane such that small localized single domain regions of magnetic polarization or magnetic bubbles aligned opposite to the general polarization direction may be supported. These localized magnetic domains or magnetic bubbles are generally cylindrical in configuration and may represent binary memory bits as "1's", with the absence of sch magnetic domains or magnetic bubbles referred to as "voids" representing "0's". Magnetic bubble memory structures offer increased density of data storage per unit area as compared to other types of memory structures, such as the so-called random access type memory, although providing serial readout with increased data access time. Although data retrieval with the random access type memory as defined by a matrix of semiconductor memory cells or magnetic cores enables any particular bit or word stored in the memory to be accesed in extremely fast time, this increased speed is accompanied with increased costs such that the cost per bit of stored information tends to be cheapest with the memory structures having the slowest data access time and most expensive with the memory structures offering the fastest data access time. Thus, magnetic bubble memory structures of large capacity storage even though requiring a relatively long time in data acquisition may offer cost economies as compared to random access memory structures of semiconductor memory cells or magnetic cores.

Although a magnetic bubble memory structure having the older major loop-minor loop circuit architecture or the more recent "block replicate" form offers certain economic and operational advantages (e.g. being of non-volatile character wherein a cessation of power does not automatically destroy the data information contained by the storage loops), every loop in every chip of the memory system must be perfect in order for the memory system to perform satisfactorily. Thus, without more, a defect in any one of the storage loops would require discarding the entire magnetic bubble memory chip. This defect factor has been recognized, and various techniques have been proposed in the art for permitting a magnetic bubble memory chip having one or more storage loops of a defective character to be used.

U.S. Pat. No. 3,792,450 Bogar et al issued Feb. 12, 1974 discloses one such technique for identifying and isolating defective storage loops on a magnetic bubble memory chip so as to enable the magnetic bubble memory chip to be used by controlling information storage in a manner avoiding the use of the defective storage loop(s). In U.S. Pat. No. 3,792,450 Bogar et al, a separate control loop is provided on the chip in addition to the plurality of storage loops, with the data information regarding defective storage loops being stored in the control loop. This data information is used to control the subsequent transfer of data information into the plurality of storage loops so that no data information is transferred into those areas of the storage loops which earlier were unable to completely pass magnetic bubbles therethrough. The synchronization and redundancy data as provided for on the magnetic bubble memory chip of U.S. Pat. No. 3,792,450 Bogar et al is effectively limited to use with a chip architecture of the major loop-minor loop type and would not be readily modified for use in a block replicate chip architecture. In this respect, the magnetic bubble memory chip as disclosed in U.S. Pat. No. 3,792,450 Bogar et al requires the use of three separate minor loops, two such loops for synchronization and a separate loop (i.e., the control loop) for redundancy.

Another such redundancy technique is described, for example, in U.S. Pat. No. 3,909,810 Naden et al issued Sept. 30, 1975, wherein a separate magnetic bubble flag chip is employed to store the locations of defective storage loops on the actual magnetic bubble memory chip. Other techniques include that described in U.S. Pat. No. 4,070,651 Naden issued Jan. 24, 1978, wherein a non-volatile semiconductor memory, such as a programmable read-only-memory, is employed to store redundancy data identifying the relative positions of defective storage loops to each other. This redundancy data is used to control logic so that a stream of magnetic bubbles to be transferred into the loops for storage, for example, contains intermittent voids corresponding to defective storage loop locations. A refinement of the latter technique is disclosed in pending U.S. Patent application, Ser. No. 752,947, filed Dec. 17, 1976 which provides for the redundancy data to be stored in an erasable non-volatile semiconductor memory to facilitate magnetic bubble data chip replacement without requiring the replacement of the entire array of redundancy data for all of the data chips included within a magnetic bubble memory system.

Whenever it is desired to access storage data from a magnetic bubble memory system, the precise location of any specific data stored within the plurality of storage loops must be known at this particular time. Thus, it is necessary to know when the input or output absolute address in the storage loops and the page address in the storage loops containing the desired data to be accessed coincide. In this respect, each storage loop contains a plurality of bit positions capable of supporting and storing magnetic bubbles as binary "1's" as well as having voids, binary "0's" stored therein, with these respective bit positions being the absolute addresses of each storage loop. However, the processing of data in a magnetic bubble memory system requires the movement of individual magnetic bubbles through each of the bit positions of the respective storage loops, with each magnetic bubble or void having a page address in relation to the corresponding bit positions of the remaining storage loops which is retained by the data as data propagation occurs through each absolute address. Thus, some form of synchronization technique is required for coordinating the specific bit positions of the plurality of storage loops to enable a user to ask for and access a specific portion of data. The user must determine the absolute address of the beginning bit position of the data stream desired to be accessed so that the appropriate page of data extending across corresponding bit positions in the plurality of storage loops can be advanced to the appropriate absolute address for transfer out of the storage loops for readout by an appropriate detector.

SUMMARY OF THE INVENTION

In accordance with the present invention, a magnetic bubble memory chip structure is provided in which a dedicated area is included for containing redundancy data as represented by a chain of bubbles and voids arranged in a predetermined manner so as to identify good and defective information data-containing storage loops of the plurality of such storage loops on the chip. The magnetic bubble memory chip structure as contemplated herein provides a bubble propagation path pattern of magnetically soft material disposed on a layer of bubble-supporting magnetic material defining bubble input and output sections, with a bubble storage section operably associated therewith, wherein the bubble storage section comprises a plurality of information data-containing storage loops. The redundancy data-containing dedicated area of the chip comprises a plurality of redundancy data-containing storage loops of equal number to the information data-containing storage loops so as to correspond thereto in a one-on-one relationship. At least one bubble detector is provided on the chip in association with the information data-containing storage loops and the redundancy data-containing storage loops for receiving readout of information data and redundancy data in an alternating coordinated sequence with each bit of information data from a respective information data-containing storage loop being preceded by a bit of redundancy data from the corresponding redundancy data-containing storage loop which identifies whether the following bit of information data is from a good or a defective information data-containing storage loop. The output from the detector is operably controlled by appropriate logic circuitry for restricting the usable readout to data delivered from good storage loops as determined by the redundancy data imparted by respective redundancy data-containing storage loops. In a specific aspect of the invention, the plurality of redundancy data-containing storage loops included in the dedicated area of the chip respectively include a total number of bit positions of the order of 3-5 in number such that the number of individual bit positions included in each information data-containing storage loop is significantly greater.

Various specific chip architectures embodying the inventive concept are disclosed. In a first such embodiment, individual input and output bubble propagation tracks are provided for the respective pluralities of information data-containing storage loops and redundancy data-containing storage loops. In another embodiment, respective combined input/output tracks are provided for each of the plurality of information data-containing storage loops and redundancy data-containing storage loops. In yet another embodiment, combined input/output tracks are provided for the respective pluralities of information data-containing storage loops and redundancy data-containing storage loops, with the control conductors for activating various magnetic bubble-affecting components on the chip being located so as to dispose all terminal connections therefor along only one marginal edge of the chip. Another embodiment arranges the redundancy data-containing storage loops in plural rows so as to accommodate a detector in a chip area adjacent the portion of the information data-containing storage loops which is not immediately adjacent corresponding redundancy data-containing storage loops. A further embodiment includes a pair of detectors respectively associated with input/output tracks for the corresponding pluralities of information data-containing storage loops and redundancy data-containing storage loops, wherein the bubble detectors are 180° out of phase with respect to each other and are operable in multiplexing sequence to sense the presence or absence of magnetic bubbles during respective half-cycles of a bubble propagation cycle.

BRIEF DESCRIPTION OF THE DRAWINGS

FIG. 2 is a diagrammatic view of another embodiment of a magnetic bubble memory structure including a dedicated area of redundancy data-containing storage loops;

FIG. 3 is a diagrammatic view of another embodiment of a magnetic bubble memory structure including a dedicated area of redundancy data-containing storage loops;

FIG. 4 is a diagrammatic view of another embodiment of a magnetic bubble memory chip in accordance with the present invention, wherein the plurality of redundancy data-containing storage loops are arranged in rows to facilitate the location of the detector on the chip; and FIG. 5 is a diagrammatic view of yet another embodiment of a magnetic bubble memory structure in accordance with the present invention, wherein a pair of detectors are provided for respective readout of information data and redundancy data in an alternating sequence.

Figure 1:
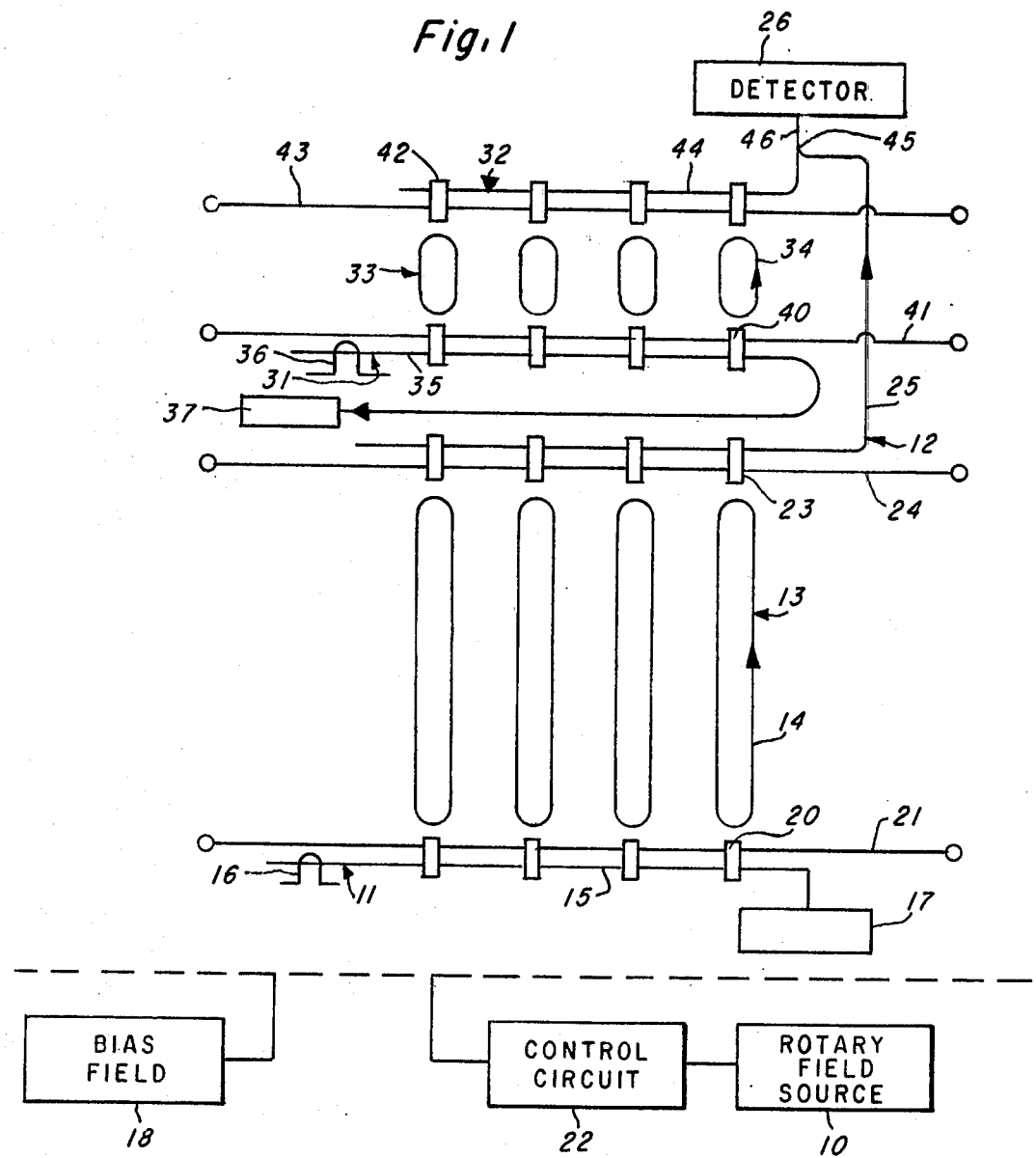
FIG. 1 is a diagrammatic view of a magnetic bubble memory chip on which a dedicated area containing a plurality of redundancy data-containing storage loops is provided in accordance with the present invention.

Referring more specifically to the drawings, FIG. 1 schematically illustrates a magnetic bubble memory structure as constructed in accordance with the present invention to include a dedicated area thereon adapted to contain redundancy data identifying the location of good and defective information data-containing storage loops of the memory. It will be understood that the magnetic bubble memory structure of FIG. 1 and of the subsequent embodiments illustrated in FIGS. 2-5 comprises a non-magnetic substrate portion having a planar bubble-supporting magnetic film or layer possessing a uniaxial anisotropy. Typically, the non-magnetic substrate is a non-magnetic rare earth garnet, gadolinium gallium garnet (GGG) for example, and the film or layer disposed thereon is an epitaxially deposited garnet layer, e.g. $(YSmCaLU)_3(FeGe)_5O_{12}$ of the order of about two microns in thickness for use with magnetic bubbles of two microns in diameter and having an easy magnetization in a direction perpendicular to the plane of the layer. Other materials suitable as the epitaxially grown layer of bubble-supporting magnetic material and which may have a thickness range of the order of 1-10 microns include: $(YSm)_3(FeGa)_5O_{12}$, $(YGdTm)_3(FeGa)_5O_{12}$, $(YEuYb)_3(FeAl)_5O_{12}$, $(YGdYb)_3(FeGa)_5O_{12}$, $(YEu)_3Fe_5O_{12}$, $(LuSm)_3Fe_5O_{12}$, $(YGd)_3Fe_5O_{12}$ and $(YSmCa)_3(FeGe)_5O_{12}$.

In FIG. 1, a bubble propagation path pattern as illustrated is disposed on the layer of bubble-supporting magnetic material (which corresponds to the plane of the sheet of drawings), the bubble propagation path pattern being adapted to guide the movement of the bubbles in the magnetic layer in response to a change in orientation of a rotary magnetic field within the plane of the magnetic layer. The rotary in-plane magnetic field is provided from a rotary field source 10. The bubble propagation path pattern may comprise an overlay pattern of magnetically soft material, e.g. permalloy, disposed on a major surface of the planar magnetic layer. In the latter connection, it will be understood that a multi-level assembly is formed on the planar magnetic layer including patterned first and second metallization layers and a layer of insulating material such as silicon dioxide, interposed therebetween. The first metallization layer is patterned to define control conductors and component parts of bubble function-affecting structures as hereinafter described. The patterned second metallization layer comprises the overlay pattern of magnetically soft material. In the embodiment of the magnetic bubble memory structure shown in FIG. 1, this overlay pattern of magnetically soft material is generally arranged to include a bubble input section 11, a bubble output section 12, and an intermediate bubble storage section 13 disposed between the bubble input section 11 and the bubble output section 12. The bubble input section 1 and the bubble output section 12 comprise major bubble propagation paths, while the intermediate bubble storage section 13 comprises a plurality of minor bubble propagation paths in the form of individual closed bubble storage loops 14. In accordance with the present invention, the storage loops 14 are more specifically referred to as information data-containing storage loops, one or more of which may be defective in some manner so as to prevent the proper processing of data information by the magnetic bubble memory structure. The bubble input section 11 comprises a major propagation path 15 including a bubble generator 16 at one end thereof and a guard rail annihilator 17 at the opposite end thereof. The bubble generator 16 may be of a suitable form, such a hairpin structure, to produce bubbles at each complete rotation of the in-plane magnetic drive field derived from the field source 10 for respective propagation along the major propagation path 15 of the bubble input section 11.

It will be understood that the individual magnetic bubbles have a diameter as determined by a magnetic bias field supplied by a source 18 and applied substantially perpendicularly to the chip. It is contemplated that bubble diameters as small as 1-5 microns may be employed in the operation of the magnetic bubble memory chip architecture disclosed in FIG. 1 and the other embodiments of FIGS. 2-5.

The input bubble propagation path 15 extends along the plurality of information data-containing storage loops 14 adjacent one end portion thereof. The input bubble propagation path 15 is coupled to the ends of the storage loops 14 by data transferring means in the form of a plurality of transfer gates 20 communicatively connecting the corresponding ends of the storage loops 14 to the input bubble propagation path 15. The transfer gates 20 may be of the one-way type, wherein data in the form of a chain of magnetic bubbles and voids is transferred from the input bubble propagation path 15 via the transfer gates 20 to the respective storage loops 14, data transfer being effected upon properly pulsing a control line 21 which extends beneath the transfer gates 20. In this connection, it will be understood that a control circuit 22 including a variable pulse generator is connected to the control line 21 and other control lines to be described hereinafter for effecting data interchange. Preferably, the transfer gates 20 are swap transfer gates of the type disclosed in U.S. Pat. No. 4,152,776

Bullock et al issued May 1, 1979 which provide for the simultaneous exchange of data from the input bubble propagation path 15 to the plurality of storage loops 14 and from the plurality of storage loops 14 to the input bubble propagation path 15. In this manner, old data contained within the storage loops 14 may be quickly replaced by fresh data from the input bubble propagation path 15 in one operation, whereupon magnetic bubbles included in the old data from the storage loops 14 upon being transferred to the input bubble propagation path 15 are thereafter propagated to the guard rail 17 where such data is annihilated.

Similarly, a plurality of replicate/transfer output gates 23 are provided between each of the respective storage loops 14 and the bubble output section 12, being arranged at the ends of the storage loops 14 opposite from the transfer gates 20. The plurality of replicate/transfer output gates 23 are operably interconnected by a control line 24 which is connected to the control circuit 22. The variable pulse generator included in the control circuit 22 upon producing a predetermined pulse of a different width as compared to the pulse required to activate the transfer gates 20 is effective to activate the respective replicate/transfer output gates 23. Upon activation by a proper pulse from the pulse generator along the control line 24, the respective replicate/transfer gates 23 perform a composite replicate/transfer function in which any bubble incident thereon from the particular storage loop corresponding thereto is replicated to provide a duplicate or replicate bubble, thereby enabling non-destructive data readout to be accomplished. One bubble is returned to the storage loop in the same virtual position from which the original bubble was input to the replicate/transfer gate 23, while the other bubble is transferred to the bubble output section 12 for propagation along the output bubble propagation path 25 to a detector 26 for readout.

In accordance with the present invention, the magnetic bubble memory chip of FIG. 1 and of the other embodiments shown in FIGS. 2–5 is provided with a dedicated area on the planar layer of magnetic bubble-supporting material in which redundancy data is contained as represented by bubbles and voids arranged in a predetermined manner to identify good and defective information data-containing storage loops 14 on the information data-containing portion of the magnetic bubble memory chip. In the embodiment of FIG. 1, the dedicated area comprising the redundancy data section of the bubble memory chip as contrasted to the information data section thereof previously described essentially duplicates the components and their relative arrangement of the information data section. Thus, the redundancy data section comprises a redundancy bubble input section 31, a redundancy bubble output section 32, and an intermediate redundancy bubble storage section 33 disposed between the redundancy bubble input section 31 and the redundancy bubble output section 32. The intermediate redundancy bubble storage section 33 comprises a plurality of redundancy bubble propagation paths in the form of individual closed redundancy bubble storage loops 34. The redundancy bubble storage loops 34 correspond in number to the information data-containing storage loops 14 and are arranged in general alignment with respective storage loops 14 in a one-on-one relationship. In a preferred form of the invention, the respective redundancy bubble storage loops 34 are defined by individual bit positions of the order of 3–5 in number as contrasted to the significantly greater number of bit positions included in each individual information data-containing storage loop 14 which may number on the order of 500–1000 bit positions, as is the case in each of the other embodiments illustrated in FIGS. 2–5.

The redundancy bubble input section 31 has a major propagation path 35 which includes a redundancy bubble generator 36 thereon, the redundancy bubble generator 36 producing redundancy bubbles at each complete rotation of the in-plane magnetic drive field derived from the field source 10 in a manner similar to that of the bubble generator 16 of the information data section on the bubble memory chip. An annihilator 37 is provided at the opposite end of the redundancy bubble input propagation path 35 to erase unwanted redundancy bubbles and old redundancy data. Similar to the transfer gates 20 and the replicate/transfer output gates 23 of the information data section, the redundancy data section is provided with transfer gates 40 and an associated control line 41 and replicate/transfer output gates 42 and an associated control line 43. It will be understood that data interchange between the redundancy data-containing storage loops 34 and the redundancy bubble input section 31 and the redundancy bubble output section 32 is accomplished via the respective transfer gates 40 and the replicate/transfer output gates 42 upon appropriate pulses being provided to the respective control lines 41 and 43 via the variable pulse generator of the control circuit 22. The respective output bubble propagation paths 25 and 44 of the information data-containing section and the redundancy data-containing section are connected to the same detector 26, the two output bubble propagation paths 25, 44 intersecting at a merge junction point 45 which is connected to the bubble detector 26 by a continuation of a single bubble propagation path 46 extending from the merge junction point 45 to the detector 26. The single continuation portion of the major propagation paths or detector feed track 46 delivers both information data and redundancy data in alternating bit positions to the detector 26, with such information data and redundancy data respectively being in the form of chains of magnetic bubbles and voids representing binary 1's and 0's for detection.

Assuming N total number of information data-containing storage loops 14, there will be N number of redundancy information-containing storage loops 34, each of which has a limited number of bit positions, i.e. 3–5 bit positions. Several copies of redundancy data identifying and locating defective storage loops 14 in the information data-containing section of the magnetic bubble memory chip can be stored in the redundancy data-containing storage loops 34 with some form of error detection and correction, thereby insuring the accuracy of data processing over extremely long periods of use. Readout of information data and redundancy data is conducted in parallel in leads connected off-chip, with the redundancy data bits preceding respective information data bits which alternate in sequence therewith in a coordinated manner on the detector feed track 46 leading to the detector 26.

As previously described, information data output from the storage loops 14 and redundancy data output from the redundancy storage loops 34 are merged at the merge junction point 45 such that successive bit positions in the detector feed track 46 alternately contain information data and redundancy data from respective storage loops 14 and corresponding redundancy storage loops 34. The detector 26 receives the output data in a sequence such that the leading bit position contains redundancy data and the successive bit position contains information data in a continuing alternating sequence. Thus, each bit position containing data information is preceded by a bit position containing redundancy information corresponding to the respective storage loop 14 and directly indicating whether the following information data is good or defective. In a typical instance, the presence of a magnetic bubble from the redundancy storage loop 34 in the leading bit position of each set of two bit positions is indicative of a good storage loop 14, thereby signifying that the information data presented by the following bit position is valid and is to be included in the final readout of data corrected for faulty storage loops 14 found on a particular magnetic bubble memory chip. Thus, usable data may be clocked into a suitable shift register from the detector 26 or directly read out. Each of the redundancy storage loops 34 contains several copies of the redundancy data in the respective bit positions thereof. Thus, in one form of the invention, all bit positions in a respective redundancy storage loop 34 will either be voids or binary "0's" indicative of a faulty or defective storage loop 14 corresponding thereto or will be filled with magnetic bubbles or binary "1's" indicative of a good storage loop 14. The storage loops 14 of the information data section and the redundancy storage loops 34 of the redundancy data section of the bubble memory chip are operated in a coordinated synchronized manner during data processing such that the leading bit position of each two bit set delivered to the detector 26 via the detector feed track 46 always contains redundancy data from a redundancy storage loop 34 corresponding to the information data-containing storage loop 14 to which the following information data presented by the second bit position applies.

The magnetic bubble memory chip architectures comprising the embodiments of FIGS. 2–5 generally operate in the same manner as has been described with reference to the embodiment of FIG. 1. Where elements similar to the components described in connection with the embodiment of FIG. 1 occurr in the embodiments of FIGS. 2–5, the same reference characters have been employed to avoid repetitious description. Turning to FIG. 2, the separate input and output tracks for the respective information data section and redundancy data section of the chip as provided in the embodiment of FIG. 1 have been replaced by a single input/output track for each of the information data section and the redundancy data section. To this end, the information data section of the bubble memory chip of FIG. 2 has a single major bubble propagation path 50 comprising an input/output track. In the latter connection, the major bubble propagation path 50 defines interchangeable bubble input and output sections operably associated with the information data-containing storage section which comprises the plurality of storage loops 14. Thus, the major bubble propagation path 50 is equipped with a bubble generator 16 at one end thereof, the bubble generator 16 being operable to produce bubbles at each complete rotation of the in-plane magnetic drive field derived from the field source 10, but only when the major bubble propagation path 50 is functioning as a bubble input section to introduce data into the information data-containing storage loops 14 via transfer gates 51 corresponding to respective storage loops 14. The transfer gates 51 are disposed adjacent respective end portions of the storage loops 14 and are activated by a control conductor 52 extending therebeneath through pulses delivered by the variable pulse generator of the control circuit 22. The transfer gates 51 are swap transfer/replicate gates which may function in the manner of the swap transfer/replicate gates described in U.S. Pat. No. 4,156,935 issued May 29, 1979 in three operational modes—transfer in (may be accompanied by "swap" function), transfer out, and transfer/replicate modes—all of which are accomplished in response to respective energy pulses of predetermined differing magnitudes from the variable pulse generator of the control circuit 22 as transmitted along the control line 52.

In like manner, the redundancy data section of the embodiment shown in FIG. 2 has but a single major bubble propagation path 53 serving as an input/output track for the redundancy data section in association with the plurality of redundancy storage loops 34. Thus, the single major bubble propagation path 53 of the redundancy data section interchangeably serves as a redundancy bubble input section and a redundancy bubble output section, being equipped at one end thereof with a bubble generator 36. The major bubble propagation path 53 of the redundancy data section is operably associated with each of the plurality of redundancy storage loops 34 via respective transfer gates 54 which are of the same functional character as the transfer gates 51 of the information data section of the chip. Thus, the transfer gates 54 respectively comprise swap transfer/replicate gates having the same three operating modes as the previously described transfer gates 51, each of the swap transfer/replicate gates 54 being arranged in operable relationship to an end portion of a corresponding redundancy storage loop 34 and communicatively connecting the input/output track provided by the single major bubble propagation path 53 to the redundancy storage loops 34. An elongated control conductor 55 underlying the swap transfer/replicate gates 54 is effective to provide respective energy pulses of predetermined differing magnitudes to the transfer gates 54 as produced by the variable pulse generator of the control circuit 22 in a similar manner to that described in connection with the control conductor 52 for the information data-containing section to cause the transfer gates 54 to operate in any one of the three operating modes.

It will be understood that data in the form of a stream of magnetic bubbles and voids defining respective binary "1's" and "0's" in a predetermined sequence may be introduced into the information data-containing storage loops 14 via the single major bubble propagation path 50 operating in an input track mode by causing the transfer gates 51 to operate in a "swap transfer" mode or "transfer in" mode. Similarly, information as to the identification and location of defective storage loops 14 may be stored within the redundancy storage loops 34 of the redundancy data section by operating the single major bubble propagation path 53 as an input track and the transfer gates 54 in the "swap transfer" mode or "transfer in" mode to place redundancy data within the respective redundancy storage loops 34. As described in connection with the embodiment of FIG. 1, readout involves the sensing of bit positions alternating between the redundancy data section and the information data-containing section as disposed on the detector feed track 46 leading to the detector 26.

FIG. 3 illustrates another embodiment of a chip architecture for a magnetic bubble memory structure in accordance with the present invention. The embodiment of FIG. 3 is generally similar to the embodiment of FIG. 2, but is so constructed as to arrange for all leads for the bubble-affecting functional components and the control conductors for regulating the operation of bubble-affecting functional components to be disposed at the same marginal edge of the chip. To this end, it will be observed that all of the lead patterns in the embodiment of FIG. 3 terminate along the upper marginal edge of the chip for connection to peripheral structures, such as the rotary field source 10, the control circuit 22 and the bias field source 18. Thus, the generator for the information data-containing section to input magnetic bubbles to the storage loops 14 via the major bubble propagation path 50 and the 3-way transfer gates 51 is defined by the elongated U-shaped conductor 60, and the control line regulating the operation of the transfer gates 51 in any one of the three operating modes is defined by the elongated control conductor 61. In like manner, the bubble generator for the redundancy data section is defined by the elongated U-shaped conductor 62, and the control line for regulating the operation of the 3-way transfer gates 54 in the redundancy data section is defined by the elongated control conductor 63. The bubble detecting means may include an active detector 26 for sensing the presence or absence of a magnetic bubble and a dummy detector for canceling noise caused by the rotating field flux. The rotating field has an equal effect on the active detector 26 and the dummy detector, therefore canceling those signals caused by the rotating field and resulting in a signal if a magnetic bubble appears on the active detector 26, the signal being delivered by lead terminals 64, 64, whereas lead terminals 65, 65 correspond to the dummy detector. By way of example, there may be 256 information data-containing storage loops 14 and a like number of redundancy storage loops 34, with each information data-containing storage loop 14 having 513 bit positions and each redundancy storage loop 34 having 5 bit positions. The distance along the major bubble propagation paths from each of the information data-containing section and the redundancy data-containing section is arranged such that a total of $N_1$ propagation steps are present from the bit position on the major bubble propagation path 53 of the redundancy data section next adjacent to the last transfer gate 54 and the redundancy storage loop 34 serviced thereby, while the corresponding propagation distance of the information data-containing section along the major bubble propagation path 50 is $N_1+1$ steps. The two major bubble propagation paths 50 and 53 from the information data-containing section and the redundancy data-containing section respectively intersect at the merge junction point 45 such that bit positions along the detector feed track 46 alternately include data from the redundancy data-containing section and the information data-containing section, with the redundancy data being disposed in a leading bit position proceding each bit position containing information data in the manner previously described.

In the chip architecture as shown in FIG. 4, the basic arrangement of the information data-containing section and the redundancy data-containing section is similar to that of the embodiments shown in FIGS. 2 and 3 in that 3-way transfer gates are provided in association with the respective information data-containing storage loops 14 and the redundancy storage loops 34, with the respective storage loops 14 and redundancy storage loops 34 being accessed for write and read modes via the same major bubble propagation path. In this instance, the terminal leads as provided on the chip are present on adjoining marginal edge portions of the chip in contrast to the arrangement of FIG. 3, but the redundancy data section has been arranged to save chip space by providing plural rows of redundancy storage loops 34 such that the number of redundancy storage loops 34 remains the same as the number of information data-containing storage loops 14, but the redundancy storage loops 34 extend widthwise of the chip so as to be in general alignment with only a portion of the total number of storage loops 14. Thus, the active detector 26 and the dummy detector associated therewith can be located in the unused portion of the chip surface in general alignment with the remaining portion of the plurality of storage loops 14 which does not have corresponding redundancy storage loops 34 arranged in general coincidence therewith. The configuration of FIG. 4 offers certain space economies on the magnetic bubble memory chip, but requires separate major bubble propagation paths 70, 71 for each row of redundancy storage loops 34 (two such rows of redundancy storage loops 34 being illustrated in FIG. 4). It will be understood that three or more rows of redundancy storage loops 34 may be provided in this embodiment of the magnetic bubble memory chip as constructed in accordance with the present invention, with each such row of redundancy storage loops 34 having its own major bubble propagation path. Prior to merging the redundancy data with the information data, the plural major bubble propagation paths 70, 71 of the redundancy data section must themselves be merged at a merge junction point 72. Each major bubble propagation path 70, 71 of the redundancy data section is equipped with its own bubble generator 73, 74 respectively for inputting magnetic bubbles included in the data stream of magnetic bubbles and voids introduced into the redundancy storage loops 34 via the respective 3-way transfer gates 54. A single control conductor 75 is provided for the respective rows of redundancy storage loops 34, the control conductor 75 having a sinuous pattern so as to extend beneath each of the transfer gates 54 for each of the redundancy storage loops 34 included in the plural rows thereof.

In each of the embodiments illustrated in FIGS. 1–4, the effective data readout can proceed at the same rate as the field rate at which data is introduced to the information data-containing section and the redundancy data-containing section of the chip. In the embodiment of FIG. 5, data readout is possible at a rate equal to twice the field rate by virtue of providing first and second bubble detectors 80 and 81 which are so constructed as to be 180° out of phase with respect to each other and being operable to sense the presence or absence of magnetic bubbles during respective half-cycles of a bubble propagation cycle. The first detector 80 is associated with the information data-containing section of the chip, and the second detector 81 is associated with the redundancy data-containing section. The pair of detectors 80 and 81 are connected in series, with multiplexing being provided to detect redundancy data and then information data during each half-cycle of bubble propagation. The arrangement of the information data-containing storage loops 14 and the redundancy storage loops 34 is configured in the manner of the embodiments of FIGS. 1–3 in that each storage loop 14 has a corresponding redundancy storage loop 34 located in general alignment therewith, with the first and second detectors 80, 81 being interposed between the pluralities of storage loops 14 and redundancy storage loops 34. Further, the pluralities of storage loops 14 and redundancy storage loops 34 are separated into plural groups, each group consisting of a like number of individual storage loops 14 or redundancy storage loops 34. As shown in FIG. 5, two such groups A and B consisting of four storage loops 14 or redundancy storage loops 34 each are provided. It will be understood, however, that this showing is illustrative only, since three or more groups, each including any number of individual storage loops 14 or redundancy storage loops 34 may be provided. Each group of storage loops 14 and redundancy storage loops 34 is provided with its own major bubble propagation path equipped with a separate bubble detector and subsequently merging into a single detector feed path which leads to the respective detector 80 or 81. To this end, it will be observed that groups A and B of storage loops 14 are respectively associated with major bubble propagation paths 82 and 83, each equipped with a bubble generator 84 and 85 at one end thereof. The major bubble propagation paths 82 and 83 interchangeably function as input/output tracks in the manner previously described with respect to the major bubble propagation paths of the information data-containing sections for the embodiments of FIGS. 2-4. The plurality of 3-way transfer gates 51 are regulated by a single control conductor 52 for accomplishing transfer of data into and out of the respective storage loops 14 of the groups A and B. The pair of bubble propagation paths 82 and 83 intersect at a merge junction point 86 from which a single feed detector track 87 extends to the first detector 80. In like manner, the groups A and B of redundancy storage loops 34 are respectively provided with separate major bubble propagation paths 90 and 91 which intersect at merge junction point 92 in a detector feed track 93 leading to the second detector 81. 3-way transfer gates 54 are provided between corresponding end portions of the redundancy storage loops 34 and the respective major bubble propagation paths 90 and 91 for the groups A and B of redundancy storage loops 34, the transfer gates 54 being regulated by a single control conductor 55 in the manner previously described in connection with the embodiment of FIG. 2. Each of the major bubble propagation paths 90 and 91 is equipped with a suitable bubble generator 94 and 95 respectively for generating redundancy magnetic bubbles to be introduced into the redundancy storage loops 34 when the major bubble propagation paths 90 and 91 are serving as input tracks therefor.

In operating the magnetic bubble memory chip of FIG. 5, multiplexing is carried out in a predetermined sequence with respect to the operations of the respective groups A and B of storage loops 14 and redundancy storage loops 34. As previously noted, the first and second detectors 80 and 81 are operated 180° out of phase with respect to each other, thereby being operable to sense the presence or absence of magnetic bubbles during respective half-cycles of a bubble propagation cycle. Additionally, the respective groups A and B of storage loops 14 and redundancy storage loops 34 are so arranged as to be 180° out of phase with each other such that information data from the storage loops 14 is arranged on the feed detector track 87 to provide information data in alternating bit positions from the respective groups A and B of storage loops 14. A similar arrangement is effected in connection with the respective groups A and B of redundancy storage loops 34. The two detectors 80 and 81 are of unipolar design so as to produce a unipolar detector signal of one-half cycle in duration. Thus the respective readouts from the first and second detectors 80 and 81 will comprise alternate signals from the groups A and B of storage loops 14 intermixed with alternate signals from the groups A and B of redundancy storage loops 34, with a redundancy signal preceding the information data signal of the corresponding redundancy storage loop 34 and the storage loop 14. The detectors 80 and 81 may be connected to the same sense amplifier (not shown) which may be of a suitable conventional construction. The multiplexing effect achievable by the chip architecture of FIG. 5 enables the total rate at which data may be read out of the chip to be twice the field rate at which data may be introduced into the storage loops 14 and the redundancy storage loops 34 of the respective groups A and B.

In each of the embodiments described, a dedicated area is provided on the magnetic bubble memory chip for the storage of redundancy data for identifying and locating defective storage loops of the chip. The redundancy storage loops are defined by a number of bit positions significantly lower than the number of bit positions comprising a respective information data-containing storage loop, the number of bit positions in a redundancy storage loop being typically 3-5 bit positions. It will be understood that each of the bit positions in an individual redundancy storage loop will contain redundancy data of the same character. Thus, where the presence of a magnetic bubble or a binary "1" is representative of a defective information data-containing storage loop, the redundancy storage loop corresponding to the defective information data-containing storage loop will contain magnetic bubbles at each of the 3-5 bit positions thereof. Thus, duplications of redundancy maps are provided by the plurality of redundancy storage loops to guard against errors in data readout from the magnetic bubble memory chip. Alternatively, the presence of a void or a binary "0" may be used in the redundancy storage loops to represent a defective information data-containing storage loop. Furthermore, the invention is applicable to a chip architecture employing a major loop in conjunction with a plurality of minor storage loops.

Although the invention has been described with respect to specific preferred embodiments thereof, it will be understood that variations and modifications can be made within the scope of the invention by those skilled in the art. Therefore, it is intended that the appended claims be interpreted as broadly as reasonably permitted by the prior art to include all such variations and modifications within the scope of the present invention.

What is claimed is:

1. In a magnetic bubble memory structure, the combination comprising:
   a planar layer of magnetic material in which magnetic bubbles can be moved;
   a plurality of storage loops on said planar layer of magnetic material defining an information data section for containing information data as represented by magnetic bubbles and voids;
   a dedicated area on said planar layer of magnetic material defining a redundancy data section for containing redundancy data as represented by magnetic bubbles and voids arranged in a predetermined manner to identify good and defective information data storage loops, said dedicated area including a plurality of redundancy storage loops disposed on said planar layer of magnetic material for containing redundancy data to identify good and defective information data storage loops;

input/output magnetic bubble propagation path means operably associated with said pluralities of information data storage loops and redundancy storage loops;

means for transferring data as represented by magnetic bubbles and/or voids between each of said information data and redundancy storage loops and said input/output magnetic bubble propagation path means;

means coordinating data propagation of redundancy data from said redundancy storage loops and information data from said information data storage loops on said input/output magnetic bubble propagation path means to enable the redundancy data and the information data to be presented in a proper sequence for identifying the good and defective information data storage loops; and detector means operably associated with said input/output magnetic bubble propagation path means and said data propagation coordinating means for sensing the presence or absence of magnetic bubbles to enable readout of redundancy data and information data in a manner restricting the usable readout from said information data storage loops to information data delivered from good storage loops of said information data storage loops.

2. A magnetic bubble memory structure as set forth in claim 1, wherein said plurality of redundancy storage loops correspond in number to said plurality of information data storage loops.

3. A magnetic bubble domain memory structure as set forth in claim 2 wherein the number of individual bit positions included in each information data storage loop is substantially greater than the number of individual bit positions included in each redundancy storage loop.

4. A magnetic bubble domain memory structure as set forth in claim 3, wherein each of said redundancy storage loops is provided with bit positions of the order of 3–5 in number.

5. A magnetic bubble memory structure as set forth in claim 3, wherein said data propagation coordinating means includes merge means interconnected in said input/output magnetic bubble propagation path means for said information data section and said redundancy data section for interleaving redundancy data and information data in alternate bit positions as an input to said detector means.

6. A magnetic bubble memory structure as set forth in claim 5, wherein said data propagation coordinating means further includes a single detector feed track interconnected between said merge means and said detector means for delivering respective sets of bit positions containing redundancy data and information data from corresponding information data and redundancy storage loops in alternate bit positions as an input to said detector means.

7. A magnetic bubble memory structure as set forth in claim 6, wherein the pair of bit positions comprising each set of bit positions includes a leading bit position of redundancy data and a following bit position of information data, the leading bit position of redundancy data identifying the following bit position of information data as being delivered from either a good or a defective information data storage loop.

8. A magnetic bubble memory structure as set forth in claim 3, wherein said input/output magnetic bubble propagation path means comprises separate input tracks respectively associated with the input ends of said information data storage loops and said redundancy storage loops, and separate output tracks respectively associated with the other output ends of said information data storage loops and said redundancy storage loops; and said data transferring means comprises respective sets of input and output transfer gates disposed in cooperating relationship with the opposite input and output ends of each of said information data storage loops and each of said redundancy storage loops.

9. A magnetic bubble memory structure as set forth in claim 3, wherein said input/output magnetic bubble propagation path means comprises a single input/output track for said information data section and a single input/output track for said redundancy data section.

10. A magnetic bubble memory structure as set forth in claim 3, further including control means operably associated with said data transferring means for activating said data transferring means to introduce information data into said information data storage loops and redundancy data into said redundancy storage loops are alternately for transferring information data from said information data storage loops and redundancy data from said redundancy storage loops to said input/output magnetic bubble propagation path means for delivery to said detector means.

11. A magnetic bubble memory structure as set forth in claim 10, wherein said control means includes a plurality of control lines underlying said data transferring means and having respective end terminals located on the same marginal edge of said planar layer of magnetic material.

12. A magnetic bubble memory structure as set forth in claim 3, wherein said plurality of redundancy storage loops are arranged in one-on-one alignment with said plurality of information data storage loops.

13. A magnetic bubble memory structure as set forth in claim 3, wherein said plurality of redundancy storage loops are arranged in plural rows each consisting of at least one redundancy storage loop, said plural rows of redundancy storage loops being disposed in said dedicated area of said planar layer of magnetic material in proximity to a portion of said plurality of information data storage loops; and said detector means being disposed on said planar layer of magnetic material so as to be located adjacent the remaining portion of said plurality of information data storage loops.

14. A magnetic bubble memory structure as set forth in claim 3, wherein said detector means comprises first and second detectors serially interconnected with each other so as to be 180° out of phase;

said information data storage loops being connected to said first detector for delivering information data in bit positions propagated along said input/output magnetic bubble propagation path means to said first detector;

said redundancy storage loops being connected to said second detector for delivering redundancy data in bit positions propagated along said input/output magnetic bubble propagation path means to said second detector; and means alternately activating said first and second detectors in a continuing sequence for producing as an output readout alternating redundancy data signals and information data signals.

* * * * *